United States Patent
Tsai et al.

(10) Patent No.: US 7,622,334 B2
(45) Date of Patent: Nov. 24, 2009

(54) WAFER-LEVEL PACKAGING CUTTING METHOD CAPABLE OF PROTECTING CONTACT PADS

(75) Inventors: Chun-Wei Tsai, Hualien County (TW); Shih-Feng Shao, Taipei Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 115 days.

(21) Appl. No.: 12/100,392

(22) Filed: Apr. 9, 2008

(65) Prior Publication Data
US 2009/0061598 A1 Mar. 5, 2009

(30) Foreign Application Priority Data
Aug. 30, 2007 (TW) .............................. 96132321 A

(51) Int. Cl.
*H01L 21/44* (2006.01)
(52) U.S. Cl. ..................................................... 438/125
(58) Field of Classification Search ........................ None
See application file for complete search history.

(56) References Cited

U.S. PATENT DOCUMENTS

| 2006/0160273 | A1* | 7/2006 | Chen | 438/113 |
| 2007/0161158 | A1* | 7/2007 | Shao et al. | 438/125 |
| 2007/0166958 | A1* | 7/2007 | Wang | 438/460 |
| 2007/0218584 | A1* | 9/2007 | Chen | 438/106 |

* cited by examiner

*Primary Examiner*—Charles D Garber
*Assistant Examiner*—Andre' C Stevenson
(74) *Attorney, Agent, or Firm*—Winston Hsu

(57) ABSTRACT

A cutting method for wafer-level packaging capable of protecting the contact pad, in which several cavities and precutting lines are formed at the front surface of a cap wafer, and the depth of each precutting line is lesser than the thickness of the cap wafer, followed by the bonding of the cap wafer to the device wafer, which has several devices and several bonding pads disposed on the surface of the device wafer, followed by performing a wafer dicing process, along the precutting lines cutting through the cap wafer, and after removing a portion of the cap wafer that is not bonded to the device wafer, for exposing the bonding pads at the surface of the device wafer, and finally performing a dicing process for forming many packaged dies.

15 Claims, 10 Drawing Sheets

WAFER-LEVEL PACKAGING CUTTING METHOD CAPABLE OF PROTECTING CONTACT PADS

BACKGROUND OF THE INVENTION

1. Field of the Invention

The present invention is related to a cutting method for wafer-level packaging capable for protecting the contact pads, in particularly, to a cutting method for wafer-level packaging able to simplify the dicing process, improve the yield, and protect the contact pad when forming a precutting line on the cap wafer.

2. Description of the Prior Art

The semiconductor device packaging process is an important procedure, the so-called packaging is in reference to the sealing and encapsulating of the core structure inside the device, the function of the packaging is to protect the fragile semiconductor devices (such as for example, optical devices, MEMS devices, etc) against the outside environmental attacks (such as mechanical damage or micro-particle contamination, etc), and to provide the structural support and signal transmission functions.

The conventional packaging procedure is as follows. First, the processed wafer is diced into a plurality of individual distinct dies, and the individual distinct dies are placed on the leadframes and using epoxy for bonding, this step is called the mount, and followed by wire bonding or flip-chip steps, for completing the aforementioned die packaging. The disadvantages of the above are the following: the size of the packaging die as produced by this packaging method is bigger than desired, the packaging process is rather tedious, and does not lend itself to befitting the current electronic product appeals of having thinner and smaller devices, and also requiring individualized operations, such as even manual operations, and is not suitable for batch production. Furthermore, the bottleneck for this packaging technology often occurred during the later dicing process, in which outside mechanical forces can lead to structural damages, and the micro-particles generated during the cutting process can lead to product contamination, thereby reducing yield.

SUMMARY OF THE INVENTION

A main object of the present invention is to provide a cutting method for wafer-level packaging capable of protecting the contact pads for improving product yield and reliability.

For achieving the aforementioned object, the present invention is to provide a cutting method for wafer-level packaging capable of protecting the contact pads. First, a cap wafer is provided, in which the cap wafer comprises a front surface and a back surface; and the front surface of the cap wafer is used to perform a surfacing process; at the same time, a plurality of cavities and a plurality of precutting lines are formed on the cap wafer, and the depth of each precutting line is lesser than the thickness of the cap wafer. Furthermore, a device wafer is provided, in which a surface of the device wafer is disposed with a plurality of devices and a plurality of bonding pads, and followed by the bonding of the cap wafer and the device wafer, in which the cavities and the device wafer are to form a plurality of sealing chambers, respectively, for sealing the devices. Later, a cap wafer dicing process is performed at the back surface of the cap wafer along the precutting lines to dice the cap wafer to allow the portion of the cap wafer which is not bonded to the device wafer to be detached, for exposing the bonding pads of the device wafer surface. Later, a device wafer dicing process is performed, and a plurality of distinct packaged dies is formed.

This cutting method for wafer-level packaging is able to simplify the dicing process, reduce the damages and contamination due to the cutting process, and is suitable for packaging of typical electronic devices, MEMS devices, and optical devices that effectively reduces the yield damages resulted from the subsequent procedures (such as wafer dicing, breaking, washing . . . etc). Furthermore, this technology is applicable for typical semiconductor manufacturing processes, suitable for batch production, possesses ease for inspection, has higher yield rate superiority, and is able to overcome difficulties encountered by conventional technology.

These and other objectives of the present invention will no doubt become obvious to those of ordinary skill in the art after reading the following detailed description of the preferred embodiment that is illustrated in the various Figures and drawings.

DETAILED DESCRIPTION

Figure 1:
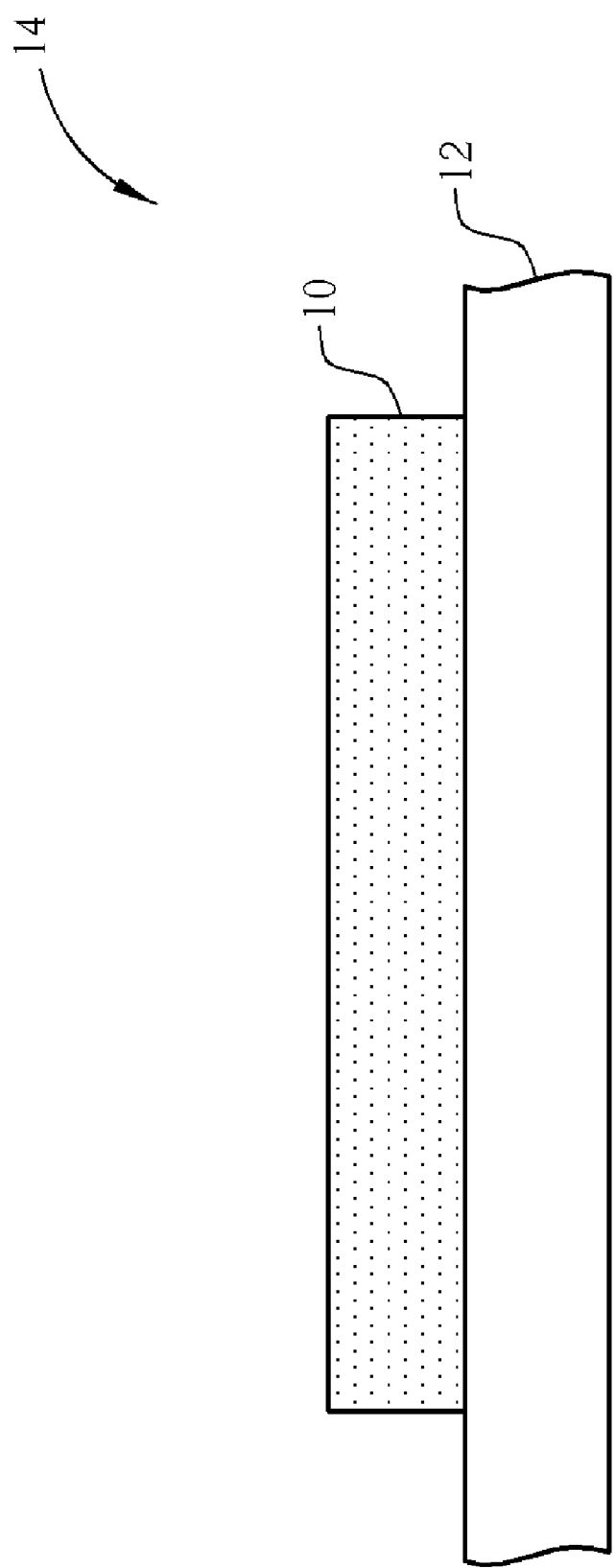
FIGS. 1-6 are a plurality of illustrative schematics showing a wafer dicing method according to a preferred embodiment of the present invention.

Referring from FIG. 1 to FIG. 6, FIGS. 1-6 are the illustrative schematics showing a wafer dicing method in accordance with a preferred embodiment of the present invention. As shown in FIG. 1, a first wafer 10 and a second wafer 12 are provided. Through anodic bonding, eutectic bonding, fusion bonding, plasma activation bonding, and other conventional wafer bonding processes, the first wafer 10 and the second wafer 12 are bonded to form a cap wafer 14. The first wafer 10 can be a standard wafer, a silicon wafer, or a patterned wafer; the second wafer 12 can be a glass wafer or a packaging wafer, a silicon wafer, or wafers of other materials. Furthermore, the choice for the cap wafer 14 is not limited to only the selection of the two-piece bonded wafer as illustrated in the present preferred embodiment, but whereas, a single-piece standard wafer or silicon wafer can also be used as the cap wafer 14.

Figure 2:
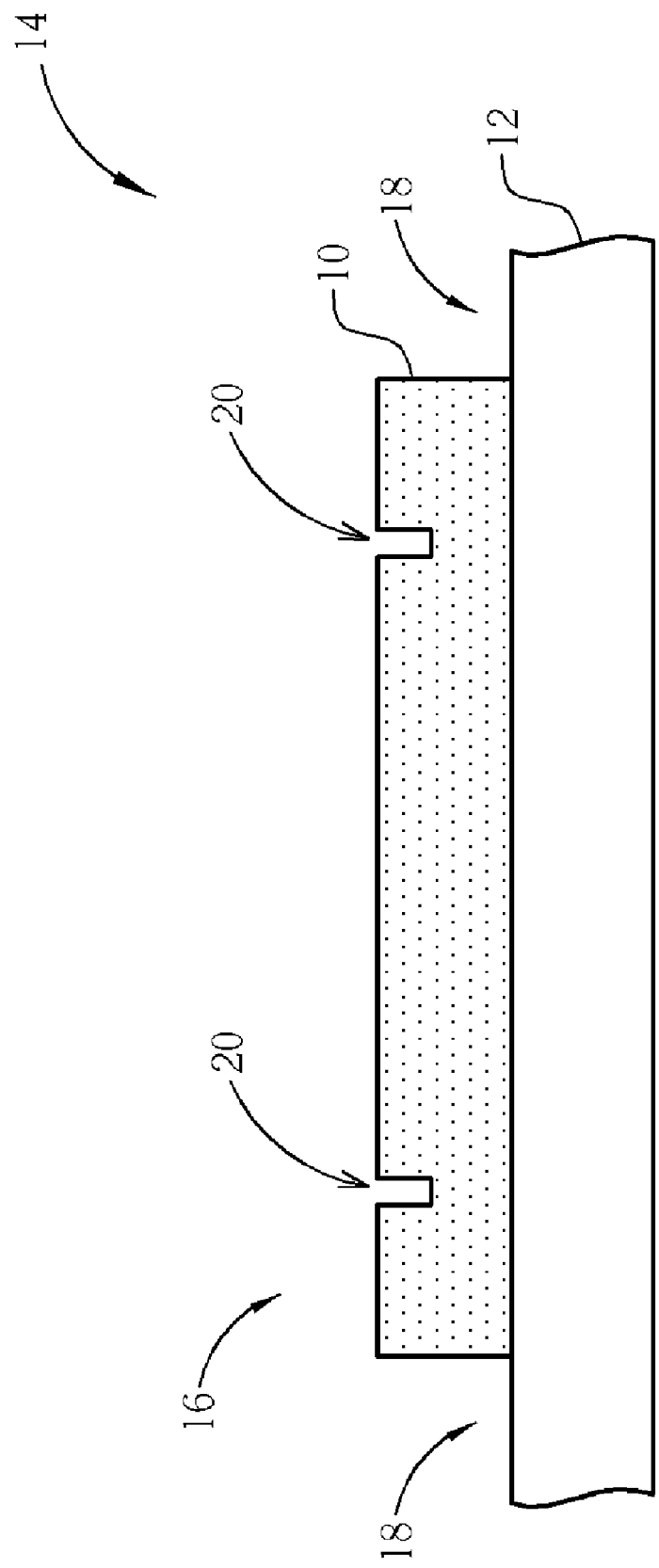

As shown in FIG. 2, a surface patterning process is performed. On a front surface 16 of the cap wafer 14, a plurality of cavities 18 and a plurality of precutting lines/prescribe lines 20 are formed at the same time. The present preferred embodiment is to first form a mask layer (not shown in the Figures) at the front surface 16 of the cap wafer 14, followed by the performing of photolithography process using a photoresist layer having the patterns for the cavities and the precutting lines, in which the objective is to transfer the cavity and precutting line patterns onto the photoresist layer. And then an etching process is performed, such as a wet etching process or a dry etching process, to perform etching to the first wafer 10, to define at the same time the cavity 18 and the precutting line 20 on the front surface 16 of the cap wafer 14, in which the dimensions of the cavity 18 are not being particularly restricted, and the linewidth of the precutting line 20 is to be as small as possible, in which the preferred linewidth of the precutting line 20 is less than 70 micrometers (µm).

Using FIG. 2 as an example, an inductive coupling plasma (ICP) etching process is used for performing the surface patterning process according to the present preferred embodiment, with $SF_6$, $C_4F_8$ and $O_2$ used as the etching gas; the coil power during etching is about 0-3000 watts (W), the platen power is about 0-250 watts, the depth of the precutting line 20 is typically less than the depth of the cavity 18, and the precutting line 20 is formed on the cap wafer 14 without forming through holes, and the depth can be smaller than or equal to the thickness of the first wafer 10. Using the present preferred embodiment as an example, the preferred linewidth ratio of the cavity 18 and the linewidth of the precutting line 20 can be less than 10 to 1. The depth of the cavity 18 and the depth of the precutting line 20 is about 500 μm and 200 μm, respectively, in which the depth of the precutting line 20 may reach 450 μm, and the precutting line 20 will not penetrate the cap wafer 14. During the actual process, the depth of the cavity 18 and the depth of the precutting line 20 can vary according to the dimensions of the linewidth. Because the linewidth of the precutting line 20 is lesser than the linewidth of the cavity 18, as a result, after the completion of the inductively coupled plasma etching process, the depth of each precutting line 20 is lesser than the depth of each cavity 18. Furthermore, the depth of the precutting line 20 is to be deepened in accordance with the increase in linewidth. For example, when the linewidth of the precutting line 20 is set to be 5 micrometers, the depth is about 200 μm. However, when the linewidth of the precutting line 20 is enlarged to 50 μm, its depth is to accordingly deepen to about 390 μm. Thus, it can be seen that the depth of the precutting line 20 and the linewidth of the precutting line 20 can be adjusted according to individual requirements.

Figure 3:
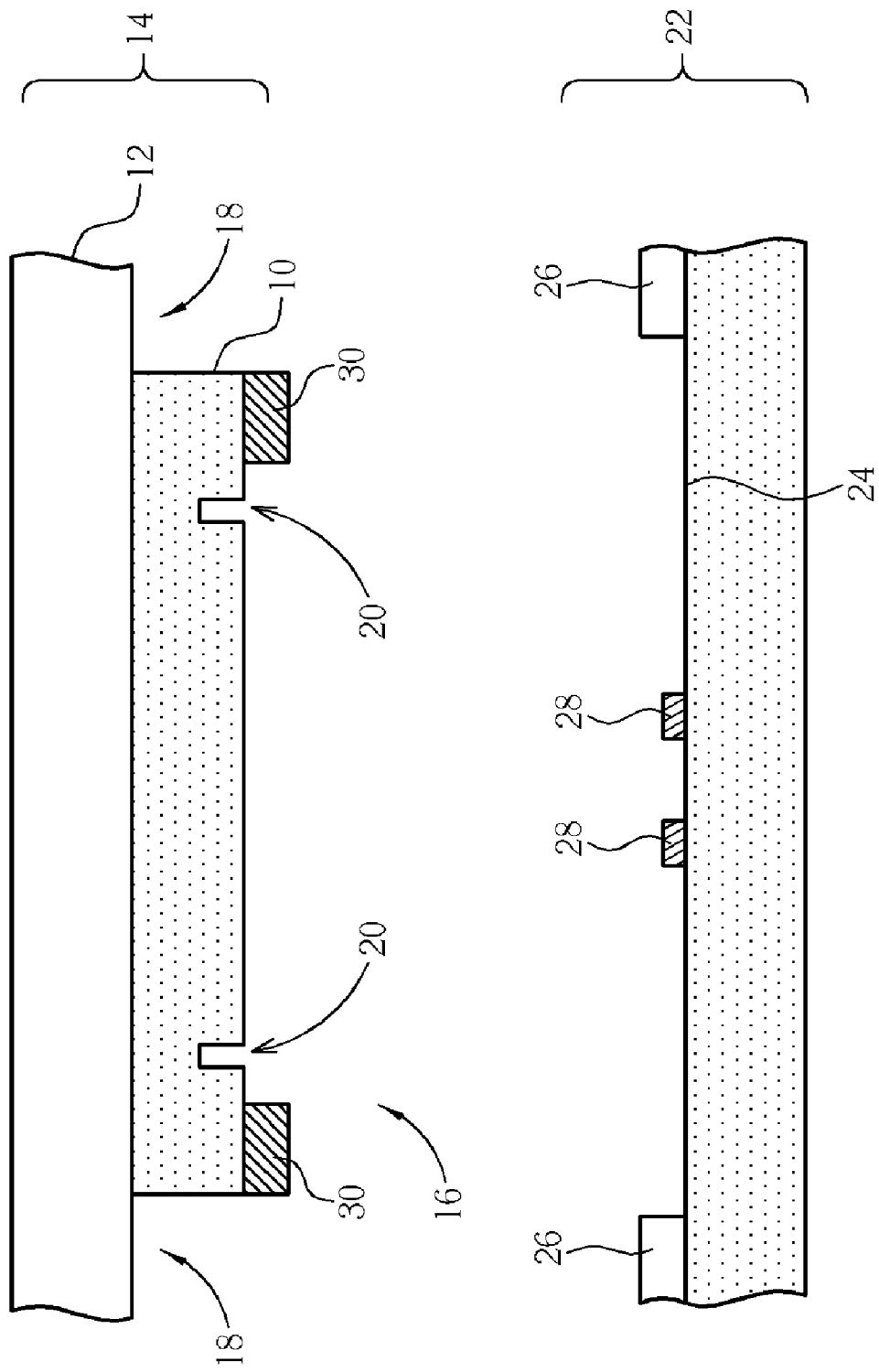

As shown in FIG. 3, a device wafer 22 is further provided, in which a plurality of devices 26 and a plurality of contact pads 28 used as electrodes are disposed on a surface 24 of the device wafer 22. The devices 26 can be optical devices, MEMS devices, or other typical electronic devices. Later, a bonding agent 30 is to be formed at the first wafer 10 surface of the cap wafer 14, which is to be bonded to the device wafer 22, for example, using screen printing technique for screen printing a layer of glass frit on the front surface 16 of the first wafer 10, or using other manufacturing processes to take materials possessing bonding ability such as polymer bonding material or metals, to be spread coated or deposited onto the front surface 16 of the cap wafer 14. The bonding agent 30 is not limited to be formed onto the front surface 16 of the cap wafer 14, and can also be formed at a corresponding location with respect to the surface 24 of the device wafer 22. In addition, the order of sequence for the fabrication processes according to the present invention is not limited to that as described in the present preferred embodiment only: the precutting line 20 is first formed at the front surface 16 of the cap wafer 14; and then the bonding agent 30 is formed; whereas, one can first form the bonding agent 30 onto the front surface 16 of the cap wafer 14, and to be followed by forming the precutting line 20.

Figure 4:
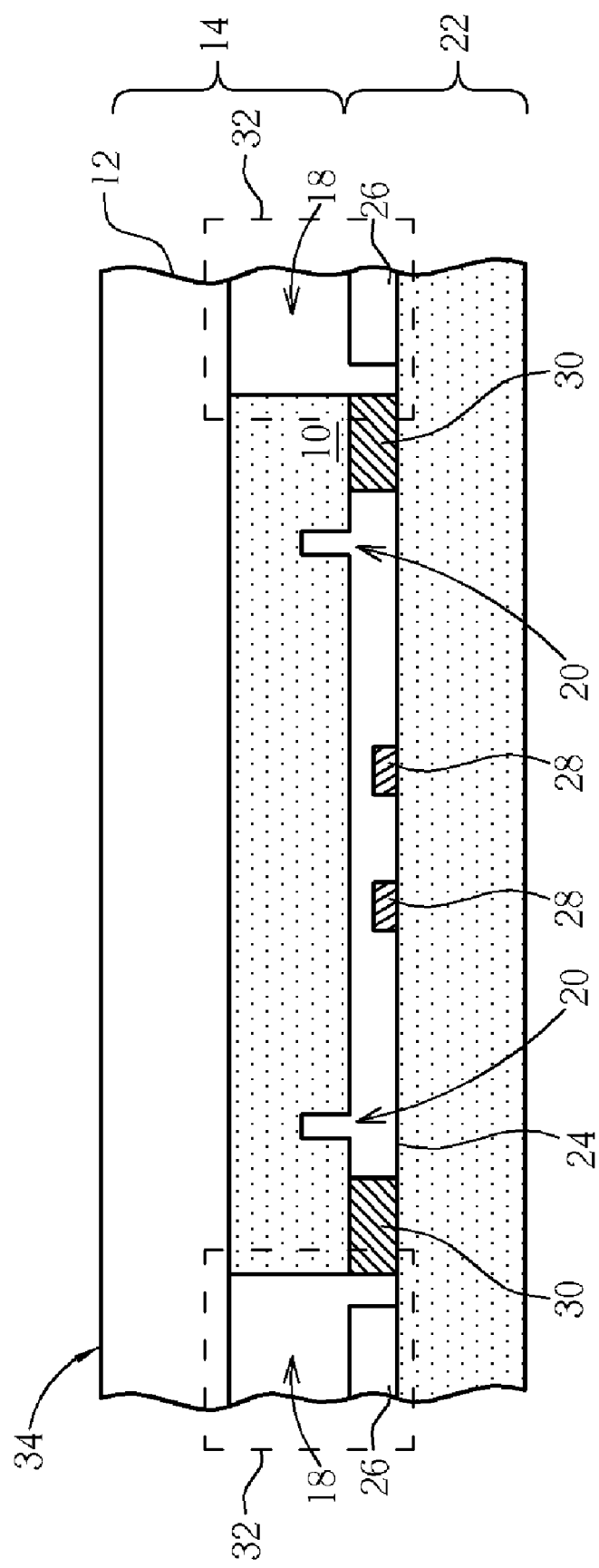

Later, as shown in FIG. 4, the cap wafer 14 and the device wafer 22 have formed an airtight bond. And the bonding method can be as described in the present preferred embodiment, which is by using glass frit bonding or Eutectic Bonding for bonding together the two wafers; and the cavities 18 of the cap wafer 14 are to be respectively matched to the devices disposed on the surface 24 of the device wafer 22. After bonding, a plurality of sealing chambers 32 are formed between the cavity 18 and the device wafer 22; and the devices are respectively sealed in each of the sealing chambers 32 for protecting the devices 26 disposed inside the sealing chamber 32.

Figure 5:
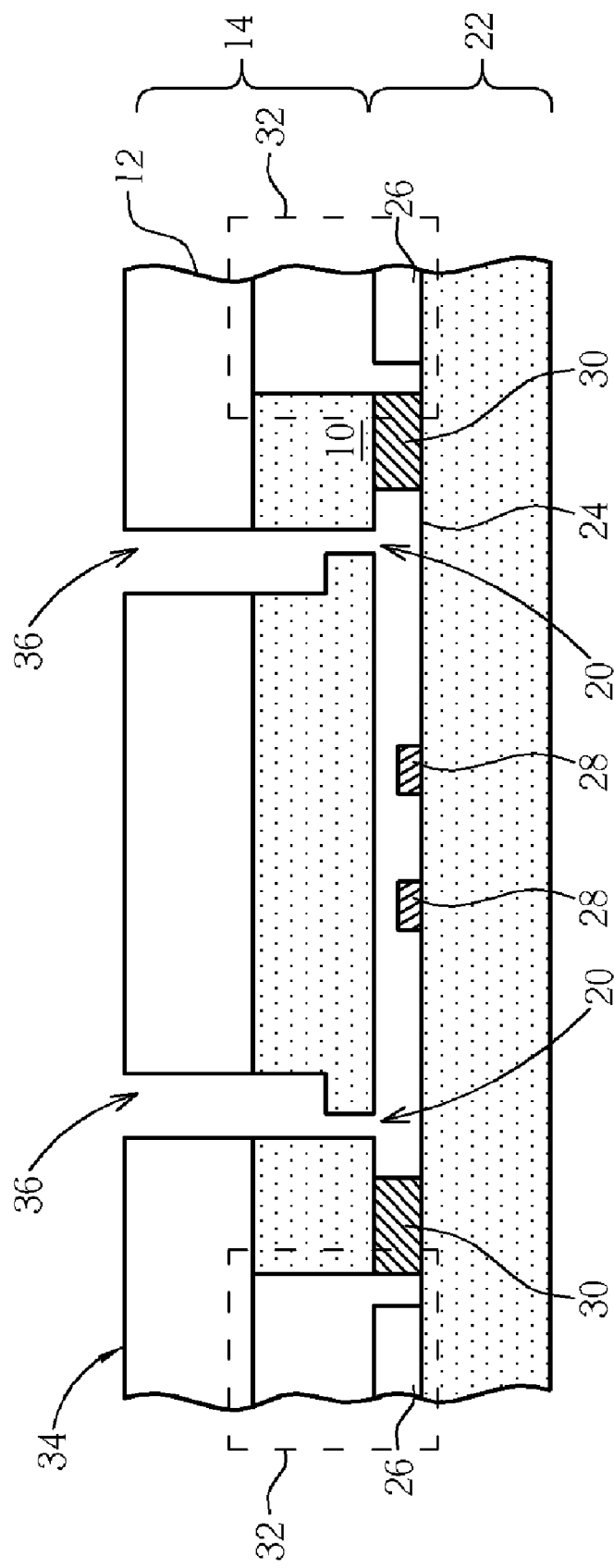
Figure 6:
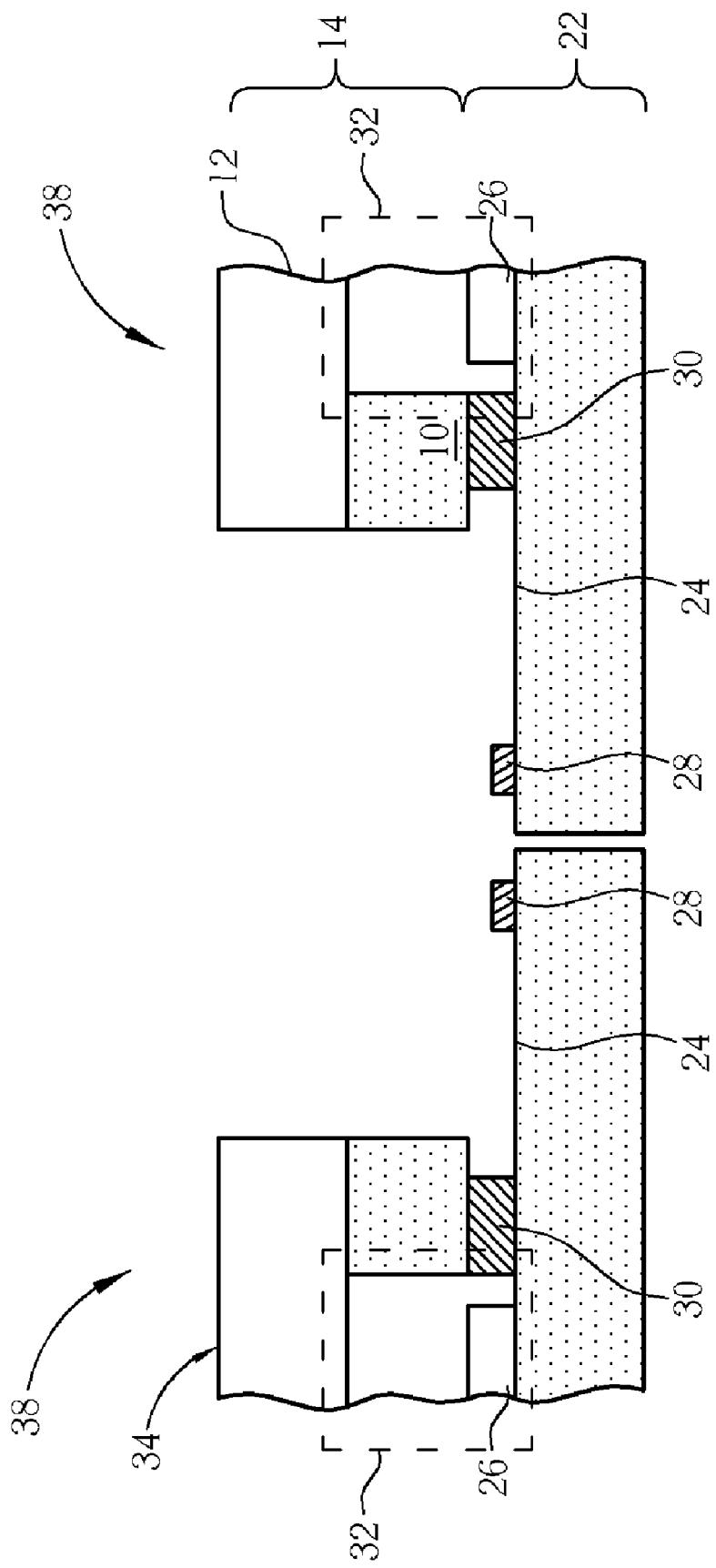

Referring to FIG. 5, a cap wafer dicing process is performed at a back surface 34 of the cap wafer 14, and along the precutting line 20 for cutting through the cap wafer 14. As shown in FIG. 6, when a saw blade used for performing the cap wafer 14 dicing process, the linewidth of a plurality of cutting streets 36 as formed by using the saw blade would be larger than the precutting lines 20 that were previously formed, but is not limited to this. Because the precutting line 20 that was previously formed is too narrow, therefore, only a limited amount of water flow can be transported along the precutting line 20. Therefore, the micro-particles or other contaminations generated during the dicing process would not easily damage the bonding pad 28 on the device wafer 22. As a result, product electrical stability is sustained, and the bonding pad 28 is prevented from being contaminated. Typically speaking, when the linewidth of the precutting line 20 which are previously formed becomes smaller during the wafer dicing process, the chance for the bonding pad 28 to be contaminated or being damaged is reduced, and thereby the product quality is improved. However, the method for cutting through the cap wafer 14 is not limited to only that of the aforementioned method of using the saw blade, and thus a dry etching process or a wet etching process can be performed instead. The dimensions of the linewidth of the cutting street 36 that is formed can be appropriately adjusted. For example, to form the cutting street 36 having the same size as the precutting line 20 linewidth, thus the object for dicing the cap wafer 14 can also be achieved. Furthermore, if the second wafer 12 of the cap wafer 14 is a glass wafer or of other transparent wafers used for performing the present wafer dicing process and if the precutting line 20 that is previously formed is to come into contact with the second wafer 12, the location of the precutting line 20 can be clearly visible during the dicing process of the wafer; thus the cutting location can be accurately controlled, and the cutting error reduced.

Please refer to FIG. 6, after the removing of a portion of the cap wafer 14 which has not bonded to the device wafer 22, thereby making the previously covered bonding pad 28 to be exposed. At this time, one can directly perform a wafer level testing for simultaneously conducting functional or electrical testing on all of the devices 26 which are packaged inside the sealing chamber 32. Later, a device wafer dicing process is then performed for separating the sealing chambers 32 and the devices inside of the sealing chamber 32 to form a plurality of distinctly packaged dies 38. The aforementioned packaging die 38 is to be further processed later for use in various types of electronic consumer products.

Figure 7:
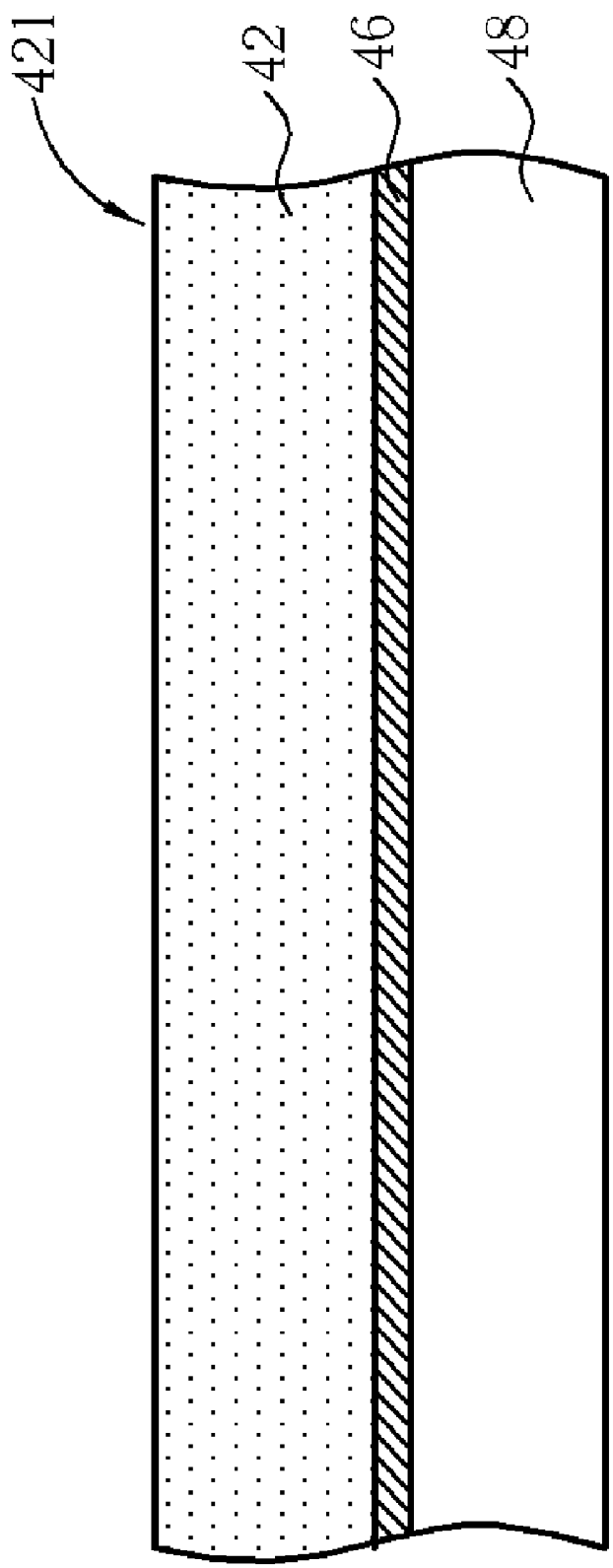
FIGS. 7-10 are a plurality of illustrative schematics showing another wafer dicing method according to another preferred embodiment of the present invention.
Figure 8:
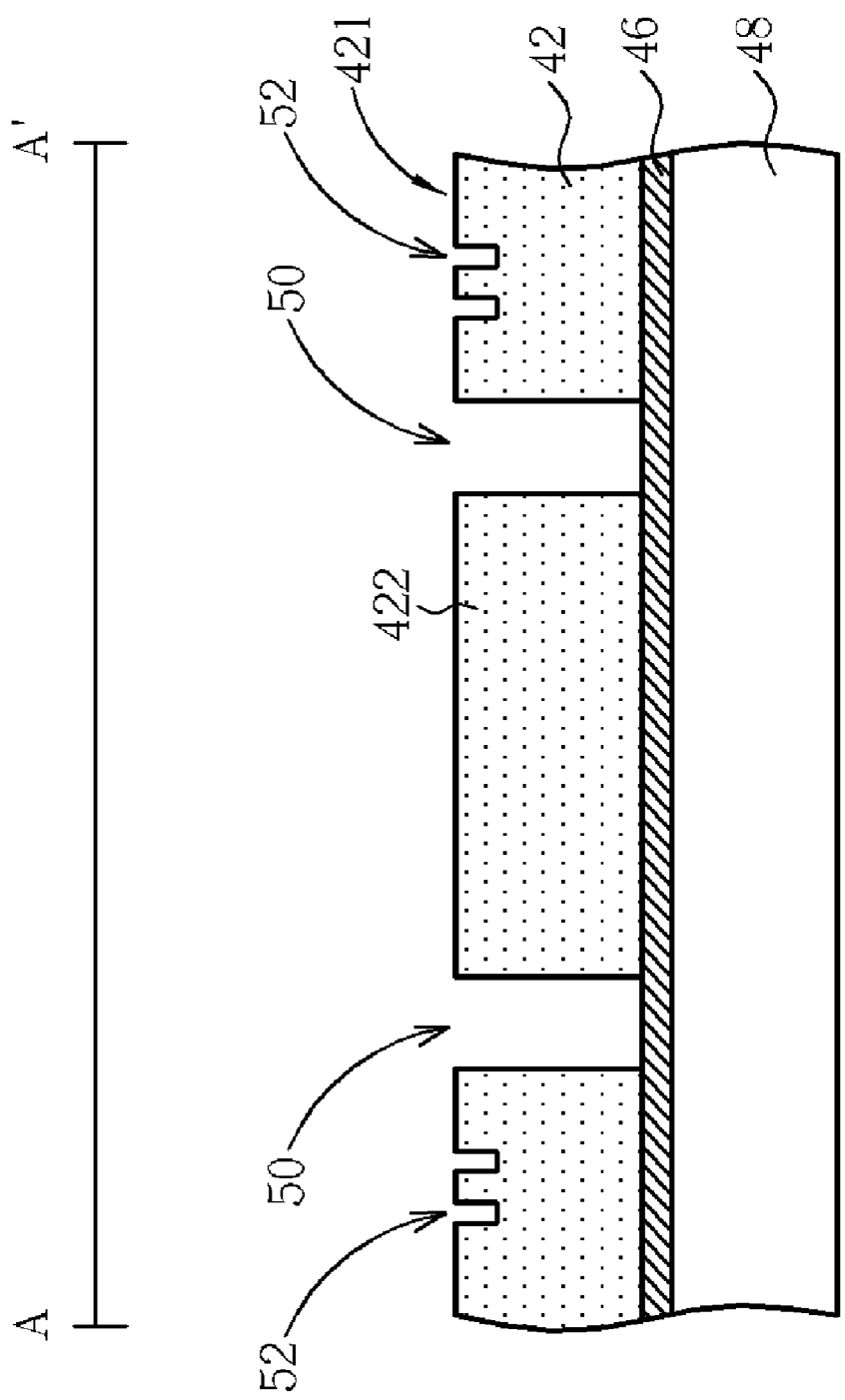
Figure 9:
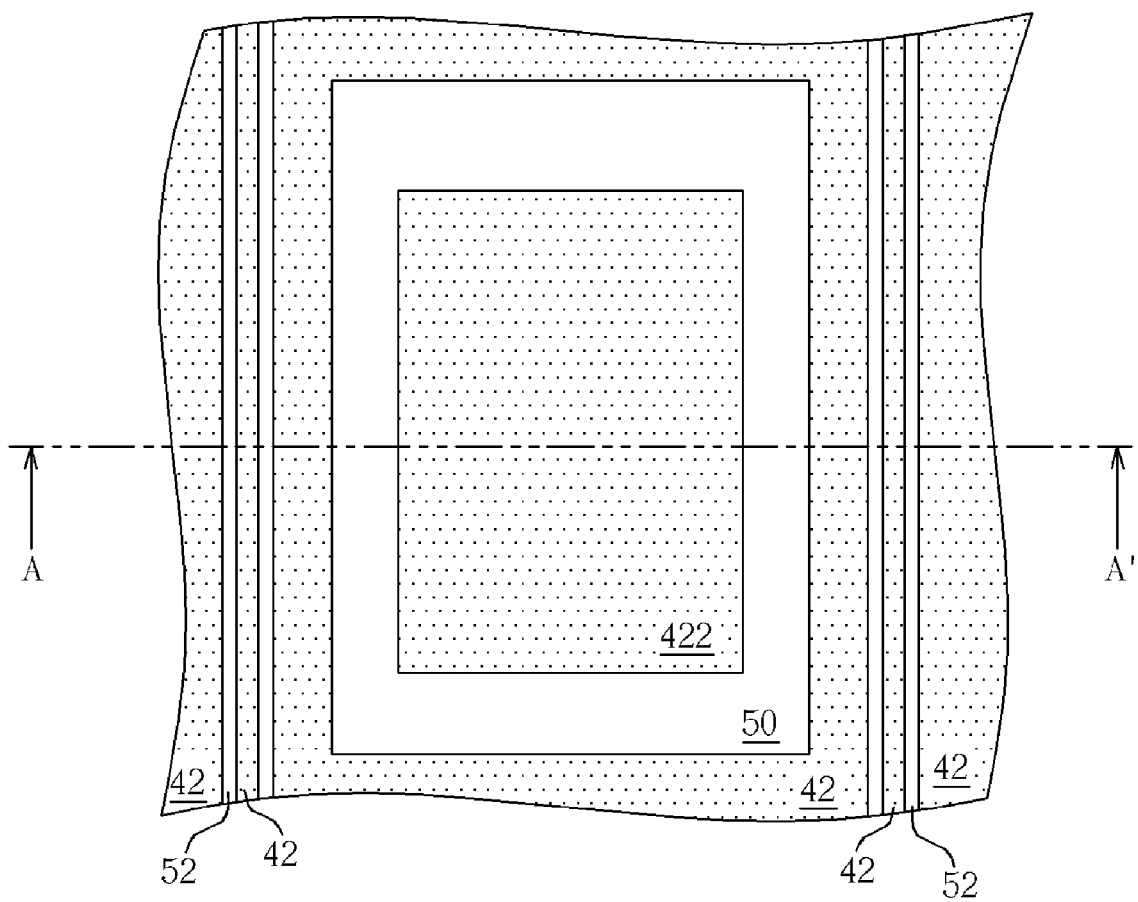
Figure 10:
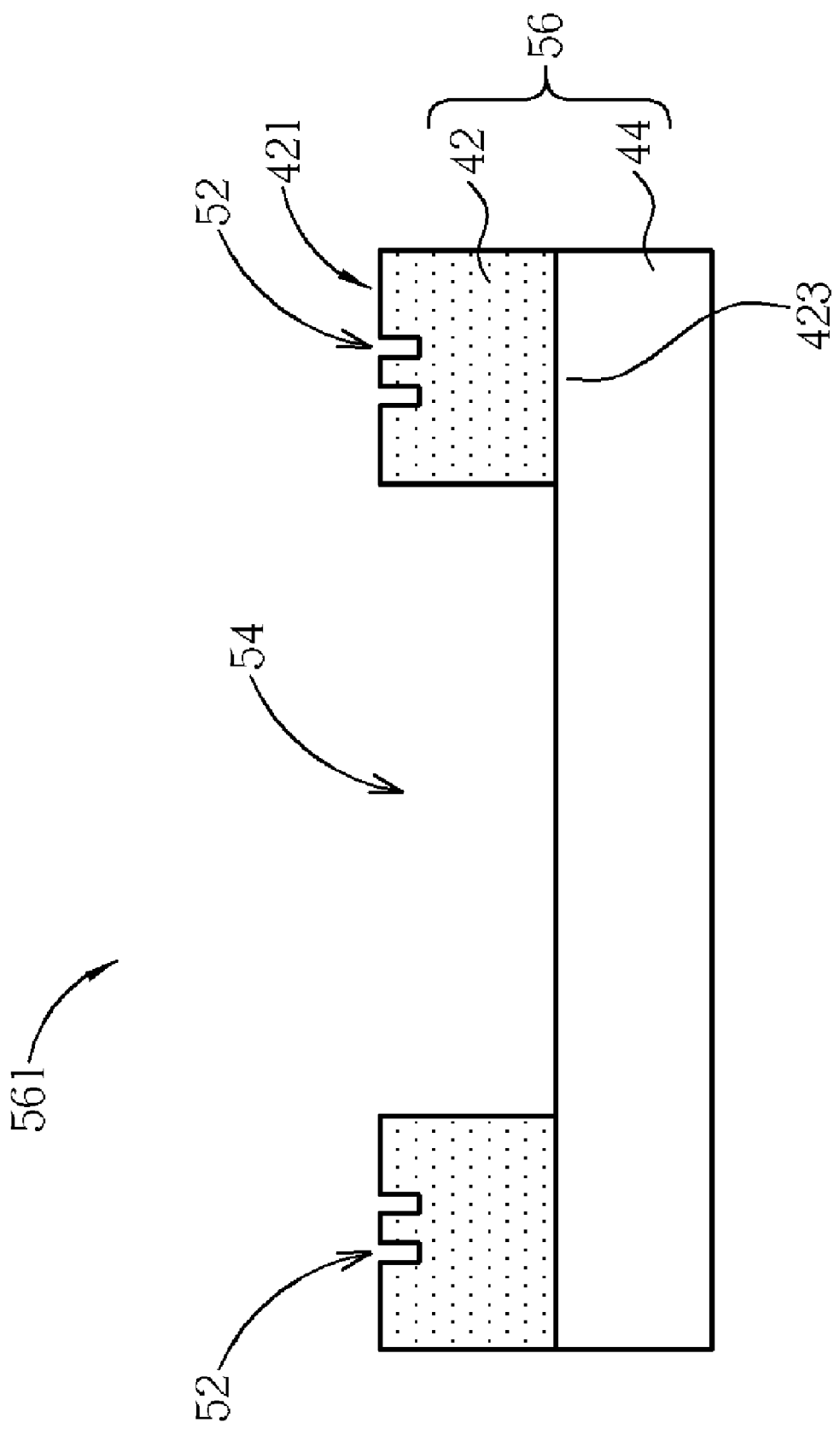

Besides the aforementioned preferred embodiment, another cutting method for wafer-level packaging is proposed according to another preferred embodiment of the present invention. Apart from being used for packaging for typical electronic devices, the present wafer dicing method is especially suitable for use in the packaging for Charge-Coupled Device (CCD), CMOS Image Sensor (CIS), other optical sensing devices, or Digital Light Processing (DLP), Liquid Crystal on Silicon (LCoS), and other optical display devices. Referring to FIGS. 7-10 for the process flow for the aforementioned embodiment. In consideration of the precision requirements on the incident light rays for the optical device after being packaged, the cap wafer of the packaged optical device includes a first wafer 42 (as shown in FIG. 7) and a second wafer 44 made of a transparent material (as shown in FIG. 10), in which the first wafer 42 can be a standard wafer or a silicon wafer, and the preferred material for the second wafer 44 includes a glass wafer or a quartz wafer. Referring to FIG. 7, for ensuring the integrity of the surface of the second wafer 44, which is made of a transparent material, during the manufacturing process according to the present preferred embodiment, an adhesive layer 46 such as UV tape, thermal release tape, or other double-sided adhesive materials is first used to bond the first wafer 42 to a wafer carrier 48 such as a glass wafer or a silicon wafer. As illustrated in FIG. 8, when performing a surfacing process on a front surface 421 of the first wafer 42, such as the first forming of a photoresist (not shown) on the front surface 421 of the first wafer 42, and followed by using a photomask having the patterns for the cavity trench and the precutting lines for conducting the photolithography process, and the objective is to transfer the patterns of the cavity trenches and the precutting lines onto the photoresist, and followed by performing an etching process, such as a wet etch or dry etch to etch the first wafer 42 to form the cavity trench 50 and the precutting line 52 at the same time. In the present preferred embodiment, an inductive coupling plasma (ICP) etching process is performed to define the cavity trenches 50 and the precutting lines 52 for performing the surface patterning process according to the present preferred embodiment, with $SF_6$, $C_4F_8$, and $O_2$ being used as the etching gases; and the coil power during etching is about 0-3000 watts (W); and the platen power is about 0-250 watts; the depth of the precutting line 52 is typically less than the depth of the cavity trench 50. The cavity trench 50 of the present preferred embodiment is extended through the first wafer 42, and the depth the precutting line 52 is less than the thickness of the first wafer 42, and the depth of the precutting line 52 may be less than or equal to the thickness of the first wafer 42 itself. For better understanding of the location and patterning of the cavity trench 50 and the precutting line 52, the top view as shown in FIG. 9 illustrates the first wafer 42 after undergone the surfacing process. The AA' line in FIG. 9 is corresponded to the AA' line in FIG. 8, and using the present preferred embodiment as an example, the line width for the cavity trench 50 and the precutting line 52 is about 500 μm and 3 μm; and the preferred line width ratio can be less than 10 to 1; and the depth for the cavity trench 50 and the precutting line 52 is about 500 μm and 200 μm, in which the depth of the precutting line 52 is for the first wafer 42 (without through holes) which can have a depth reaching 450 μm. Furthermore, the cavity trench 50 is to form a "square" configuration, and is to respectively surround a portion of the first wafer 422.

Referring to FIG. 10, the adhesive layer 46 and the wafer carrier 48 are removed, and the back surface 423 of the first wafer 42, which have the precutting line patterns defined onto the second wafer 44, are bonded. Because the present preferred embodiment is using a silicon wafer of standard thickness for the first wafer 42, which has a thickness of about 500 μm, and using the process for removing adhesive layer, such as for example, using UV tape as the adhesive layer 46, and is using an UV radiation process for making the UV tape to lose adhesion or, when using thermal release tape as the adhesive layer 46, and is to use a heating process for making the thermal release tape to lose adhesion. Later, a wafer clamp or electrostatic-chuck and other equipments for transporting the wafer are to separate the first wafer 42 from the adhesive layer 46 and the wafer carrier 48. Because at the previous step, a portion of the first wafer 422 is being surrounded and isolated by the cavity trench 50, at the same time when removing the adhesive layer 46, the portion of the first wafer 422 disposed at between the cavity trenches 50 is to remain on the adhesive layer 46, and is to be separated from the first wafer 42 comprising the precutting line 52 that had been established. After bonding with the second wafer 44, because the portion of the first wafer 422 which was originally disposed at between the precutting lines 52 is already removed, the space that has been freed up is to join together the bonded second wafer 44 to form a plurality of cavities 54. As a result, the first wafer 42 and the second wafer 44 are bonded together to form a cap wafer 56. In addition, a front surface 561 of the cap wafer 56 includes cavity and precutting line patterns that are defined for use for later packaging purposes. Later, the packaging process is the same as that for the previous preferred embodiment, and the corresponding process flow diagram and the related discussions are referenced to the previous preferred embodiment as illustrated in FIGS. 3-6 for forming a plurality of independently packaged dies, thus no further detailed descriptions are needed.

As compared to the previous preferred embodiment, the present preferred embodiment entails, during the defining of the patterns on the front surface of the first wafer 42, only to etch out the cavity trench 50 at about 500 μm to separate out the portion of the first wafer 42 at between the cavity trenches 50; when removing the adhesive layer 46, the portion of the first wafer 422 at between the cavity trenches 50 are removed together, and as the first wafer 42 and the second wafer are bonded to form the cap wafer 56, the original cavity trench 50 is to be the boundary of the cavity 54; and the front surface 561 of the cap wafer 56 is to define the dimensions and patterns for the cap wafer 56. Therefore, during the etching of the front surface 421 of the first wafer 42 (as illustrated in FIG. 9), it is only necessary to etch out the cavity trench 50 for a simplified definition of the boundary of the cavity 54, and does not require to perform etching to the pattern on the entire cavity 52, thereby reducing the etching duration during processing. Furthermore, the first wafer 42 is then to be bonded to the second wafer 44 after the cavity trench 50 and the precutting line 52; and the second wafer 44 has not undergone multiple numbers of etching process, for ensuring the flatness of the surface of the second wafer 44 to prevent the unnecessary scattering or reflecting after packaging during which the light is penetrating through.

As seen from the aforementioned preferred embodiments, the present invention is to utilize a surfacing process and to use only a single manufacturing step to form a plurality of cavities and a plurality of precutting lines on the cap wafer at the same time for replacing the conventional manufacturing method which requires two or more steps to separately form the cavities or the cutting streets, thereby reducing the entire manufacturing timespan, and effectively simplifying the dicing process post wafer bonding, and can accurately control the dicing/cutting location and depth. Due to the exceedingly narrow linewidth of the precutting line which has been preformed, it is thus effective to prevent having particle residues or contamination attacks to the bonding pad on the device wafer during the cutting through process of the cap wafer, thereby preventing surface contamination of the bonding pad. Furthermore, prior to the dicing/cutting of individual packaged dies, the entire wafer of the already-packaged wafer can be directly inspected. And the packaged die after being diced is to have similar size as the bare die. Therefore, some of the advantages of the present invention are of becoming more compatible with the currently electronic product trends for size reduction and to be suitable for batch production.

Those skilled in the art will readily observe that numerous modifications and alterations of the device and method may be made while retaining the teachings of the invention.

What is claimed is:

1. A cutting method for wafer-level packaging, comprising:

providing a cap wafer, and the cap wafer comprising a front surface and a back surface;

performing a surfacing process on the front surface of the cap wafer, and at the same time forming a plurality of cavities and a plurality of precutting lines in the cap wafer; and each of the precutting lines has a depth lesser than that of each of the cavities;

providing a device wafer, and a plurality of devices and a plurality of bonding pads are disposed on a surface of the device wafer;

bonding the cap wafer and the device wafer, and aligning the cavities to the devices for allowing a plurality of sealing chambers to be formed between the cap wafer and the device wafer, sealing each device, respectively;

performing a cap wafer dicing process at the back surface of the cap wafer, dicing the cap wafer along the precutting lines, and allowing the portion of the cap wafer not bonded to the device wafer to be detached for exposing the bonding pads of the device wafer; and performing a device wafer dicing process, and forming a plurality of distinct packaged dies.

2. The cutting method of claim 1, wherein the linewidth of the precutting line is less than 70 micrometers (μm).

3. The cutting method of claim 1, wherein the surfacing process is an etching process.

4. The cutting method of claim 3, wherein each of the precutting lines has a linewidth less than that of each of the cavities, and after performing the etching process, the depth of the precutting lines is less than the depth of the cavities.

5. The cutting method of claim 1, wherein the cap wafer dicing process comprising an etching process.

6. The cutting method of claim 1, wherein the cap wafer dicing process comprising of using a saw blade for performing the cap wafer dicing process.

7. The cutting method of claim 1, further comprising of performing a wafer-level testing after the bonding pads of the device wafer are exposed.

8. A cutting method for wafer-level packaging, comprising:

providing a first wafer;

providing an adhesive layer, for bonding the back surface of the first wafer to a wafer carrier performing a surfacing process using a front surface of the first wafer, and at the same time forming a plurality of cavity trenches and a plurality of precutting lines on the first wafer; the cavity trenches are disposed at between the precutting lines and are to surround a portion of the first wafer; and each of the precutting line has a depth lesser than that of each of the cavity trench;

removing the adhesive layer, the wafer carrier, and the portion of the first wafer surrounded by the cavity trenches;

bonding the back surface of the first wafer onto a second wafer for forming a cap wafer, and forming a plurality of cavities wherein defined at between the precutting lines at a front surface of the cap wafer;

providing a device wafer, and a plurality of devices and a plurality of bonding pads are disposed on a surface of the device wafer;

bonding the cap wafer and the device wafer, and making the cavities and the device wafer forming a plurality of sealing chambers, and respectively sealing the devices;

performing a cap wafer dicing process at the backside of the cap wafer, and dicing the cap wafer along the precutting lines, and allowing the portion of the cap wafer not bonded to the device wafer to be detached for exposing the bond pads of the device wafer;

performing a wafer-level testing; and performing a device wafer dicing process for forming a plurality of distinct packaged dies.

9. The cutting method of claim 8, wherein the second wafer comprising a glass wafer or a quartz wafer.

10. The cutting method of claim 8, wherein linewidth of the precutting line is less than 70 micrometers (μm).

11. The cutting method of claim 8, wherein the linewidth ratio for each of the cavities and each of the precutting line is less than 10 to 1.

12. The cutting method of claim 8, wherein the surfacing process is an etching process.

13. The cutting method of claim 12, wherein each of the precutting lines has a linewidth than that of each of the cavity trenches, and after the completion of the etching process, the depth of the precutting lines is lesser than the depth of the cavity trenches.

14. The cutting method of claim 8, wherein the cap wafer dicing process comprising an etching process.

15. The cutting method of claim 8, wherein the cap wafer dicing process comprising using a saw blade for performing the cap wafer dicing process.

* * * * *